United States Patent [19]
Hamilton et al.

[11] Patent Number: 6,100,706
[45] Date of Patent: Aug. 8, 2000

[54] BURN-IN BOARD SUPPORT FRAME HAVING INSERTER AND EJECTOR BARS FOR RACKS OF BURN-IN BOARDS

[75] Inventors: Harold E. Hamilton, Minneapolis; Tom A. Tremmel, New Brighton; Brian R. Bloch, Cedar, all of Minn.

[73] Assignee: Micro Control Company, Minneapolis, Minn.

[21] Appl. No.: 09/056,731

[22] Filed: Apr. 7, 1998

[51] Int. Cl.[7] .................................................. G01R 15/12
[52] U.S. Cl. ........................................ 324/760; 324/158.1
[58] Field of Search ..................................... 324/760, 765, 324/158.1, 73.1, 501, 537; 414/416, 424; 361/809, 785; 165/104.26, 80.3, 80.4

[56] References Cited

U.S. PATENT DOCUMENTS

| 4,145,620 | 3/1979 | Dice ......................................... 324/501 |
| 4,542,341 | 9/1985 | Santomango et al. ................... 361/785 |
| 4,636,725 | 1/1987 | Santomango et al. ................... 361/785 |
| 5,103,168 | 4/1992 | Fuoco ...................................... 324/73.1 |

*Primary Examiner*—Vinh P. Nguyen
*Attorney, Agent, or Firm*—Westman, Champlin & Kelly, P.A.

[57] ABSTRACT

An automatic loading and unloading support for use on the interior of a burn-in oven includes a frame that supports a rack of printed circuit burn-in boards connected to connectors along edges of the burn-in boards at one end of the rack. The frame has a track for supporting the rack for movement from an open end toward a closed end of the oven. Driver/receiver boards are mounted at the closed end and have connectors aligning with the connectors on the burn-in boards on a rack. When the rack is moved to a position closely adjacent to the driver/receiver board connectors, alignment pins will align the rack properly and then actuators are used for moving inserter bars that press against the back side of the rack and push the connectors on the burn-in boards into the connectors on the driver/receiver boards. After the burn-in test is complete, and the rack is to be removed, the actuators will first move the inserter bars to clear the opening at the open end of the frame and then actuate ejector bars to push the rack and the supported burn-in boards in a direction to uncouple the connectors of the burn-in boards from the connectors on the driver/receiver boards.

16 Claims, 7 Drawing Sheets

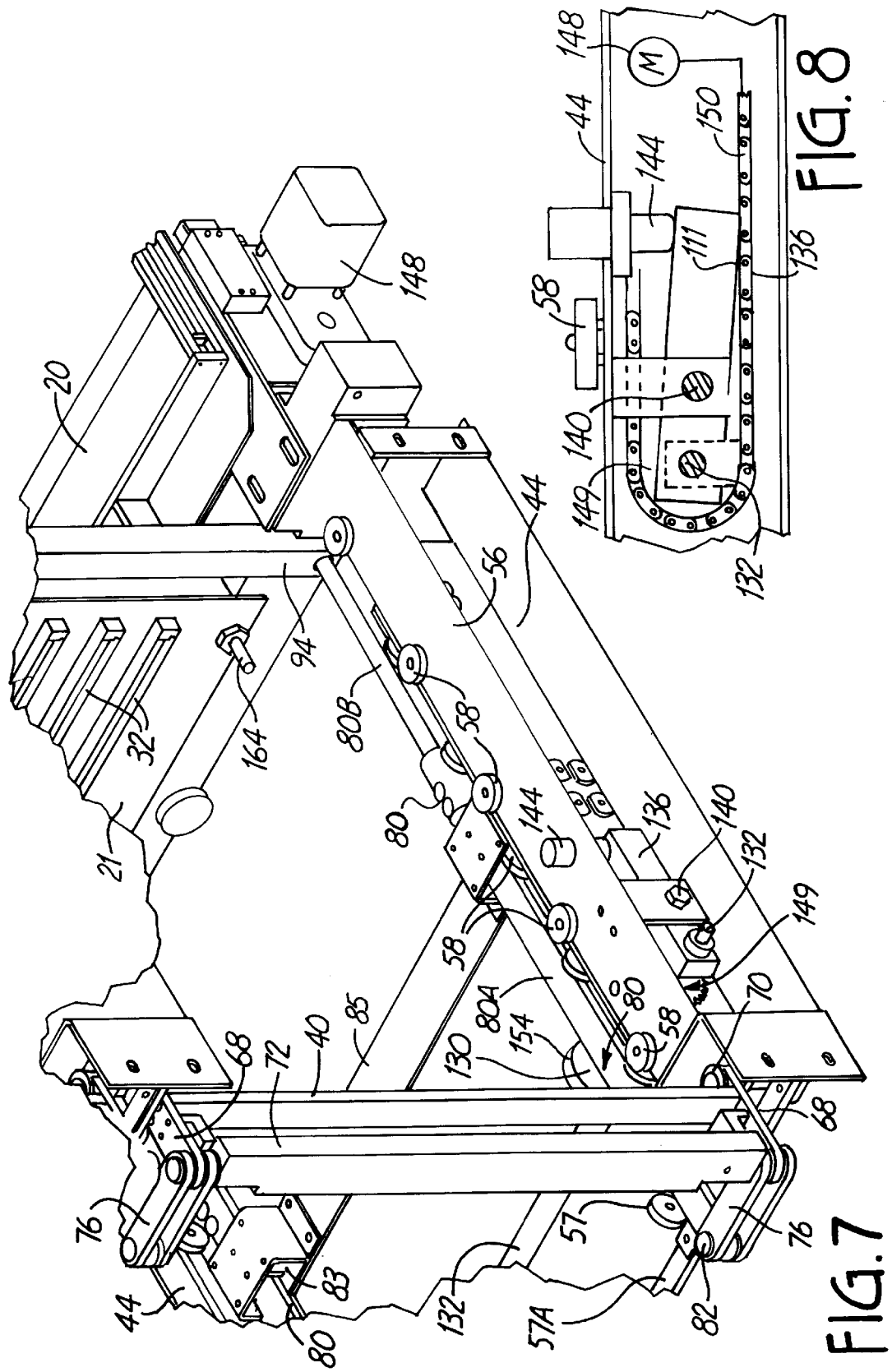

BURN-IN BOARD SUPPORT FRAME HAVING INSERTER AND EJECTOR BARS FOR RACKS OF BURN-IN BOARDS

BACKGROUND OF THE INVENTION

The present invention relates to a device for receiving a card cage or rack of burn-in boards ready to be tested in an oven, and automatically inserting the card cage or rack and burn-in boards into a frame mounted within the oven to provide reliable connection to driver/receiver boards and disconnection from the driver/receiver boards after testing is complete.

It is standard procedure to burn-in integrated circuits after manufacture, in order to test components in a heated environment. As the need for integrated circuits increases, the demand for larger burn-in ovens has become evident, in order to reduce the time from fabrication to delivery to the customer, and this has created the need for relatively large card cages or racks of prepared integrated circuits on burn-in boards, that are then inserted into connectors to test circuits while in an oven. The connectors are coupled to driver/receiver boards on the exterior of the oven. The individual insertion of boards into the connectors for driver/receiver boards has been time consuming, but no reliable automated system has been advanced.

The present invention relates to a system for insuring automatic and positive connection of burn-in boards to the driver/receiver board connectors.

SUMMARY OF THE INVENTION

The present invention relates to an inserter and ejector for burn-in boards mounted in a card cage that will insert the card cage and boards into a housing or frame in a burn-in oven, and provide a sufficient force to insure that the edge connectors of the burn-in boards are connected to the receptacles on driver/receiver boards that provide the test signals to the burn-in boards for the environmental test. The inserter/ejector of the present invention is designed to operate in connection with a frame that is of size to receive at least one card cage or rack holding several burn-in boards. The card cage or rack can either be loaded manually into the frame, or a roller table holding the card cage can be rolled adjacent to the frame and oven and then the card cage or rack can be driven or slid into the frame opening. Once the leading edge of the card cage or rack is inserted into frame and the oven, it is engaged by friction drive rollers and is guided on free rotating rollers as it is moved into the oven to a position where the edge connectors on the burn-in boards are closely adjacent to the rear wall of the oven. The rear wall carries mating connectors for the driver/receiver boards.

It is to be understood that the connectors are standard connectors that are used with conventional burn-in ovens and burn-in boards. The oven can be arranged so that the driver/receiver boards are thermally insulated sufficiently from the interior of the oven using conventional rear wall technology. Once the rack of burn-in boards is adjacent to the driver/receiver boards, guide pins are provided for guiding the card cage or rack relative to the driver/receiver board connectors to achieve a desired alignment, and upon a signal indicating that the rack is properly positioned, power actuators will move pusher bars to engage the rear side of the card cage or rack carrying the burn-in boards and push the rack under a steady force to slide the edge connectors of the burn-in boards into the receptacles of the mating connectors on the driver/receiver boards at the rear wall of the oven.

The burn-in boards are suitably secured in place on the card cage that carries the burn-in boards, so the insertion force is reacted back to the card cage or rack. Suitable electrical connections are completed from each of the components on each burn-in board to the appropriate edge connector before the boards are placed in the card cage or rack.

Once the card cage or rack with the burn-in boards supported thereon is in position in the frame, and the edge connectors of the burn-in boards have been electrically connected to the connectors on the driver/receiver boards, the burn-in test is performed in the oven in accordance with a sequential program. Suitable signals can be provided by limit switches or the like to indicate that the rack and the burn-in boards carried on the rack are in the appropriate position for the burn-in to start.

When the burn-in operation is completed, and the oven has cooled so that it can be opened, the present invention provides for either a preprogrammed or operator controlled sequence to reverse the power actuators. The actuators first will release the inserter pusher bars and move them out of the way sufficiently to clear the card cage or rack so that the rack can exit through the same opening as that used when it was inserted. Once the inserter pusher bars are clear of the sides of the rack and moving toward their home position, the power actuators will act on a pair of ejector bars that are positioned at the inner wall of the oven, which engage the leading edge of the burn-in board card cage or rack and push the card cage or rack away from the driver/receiver boards to cause disengagement of the connectors. The force that is needed to either couple or uncouple the connectors can be fairly large with a large number of burn-in boards, and with the power operated ejector bars and the power operated inserter pusher bars, the operation is taken care of easily.

Once the connectors are uncoupled, the drive that moved the card cage or rack into the frame, which has been reversed, will drive the card cage or rack and burn-in boards back out past the inserter pusher bars and out the door opening of the oven under a friction drive.

The drive for the card cage or rack acts against wall surfaces on the bottom of the rack, through O-rings that are mounted on the exterior of drive wheels to provide a friction drive that has sufficient force to move the card cage or rack toward the position where it is near the back wall of the oven, and also then to drive the rack back out once the connectors have been released by the ejector bars.

Limit switches or other position indicators can be used to insure that the rack is in its seated position with the connectors fully connected, before the test sequence is undertaken, to insure that the automatic connecting is secure. Other controls can be used as desired.

The frames can be stacked vertically in an oven, one on top of the other as shown in FIG. 1, although one level will be illustrated primarily. Each card cage can be identically constructed, supported and operated.

BRIEF DESCRIPTION OF THE DRAWINGS

FIG. 7 is a part perspective view of one lower side of a support frame showing support and guide rollers for the rack and the friction drive roller used with the present invention; and FIG. 8 is a fragmentary side view of the frame shown in FIG. 7 illustrating a mounting lever that is used on both sides of the frame for mounting a shaft for friction drive rollers.

DETAILED DESCRIPTION OF THE PREFERRED EMBODIMENTS

Figure 1:
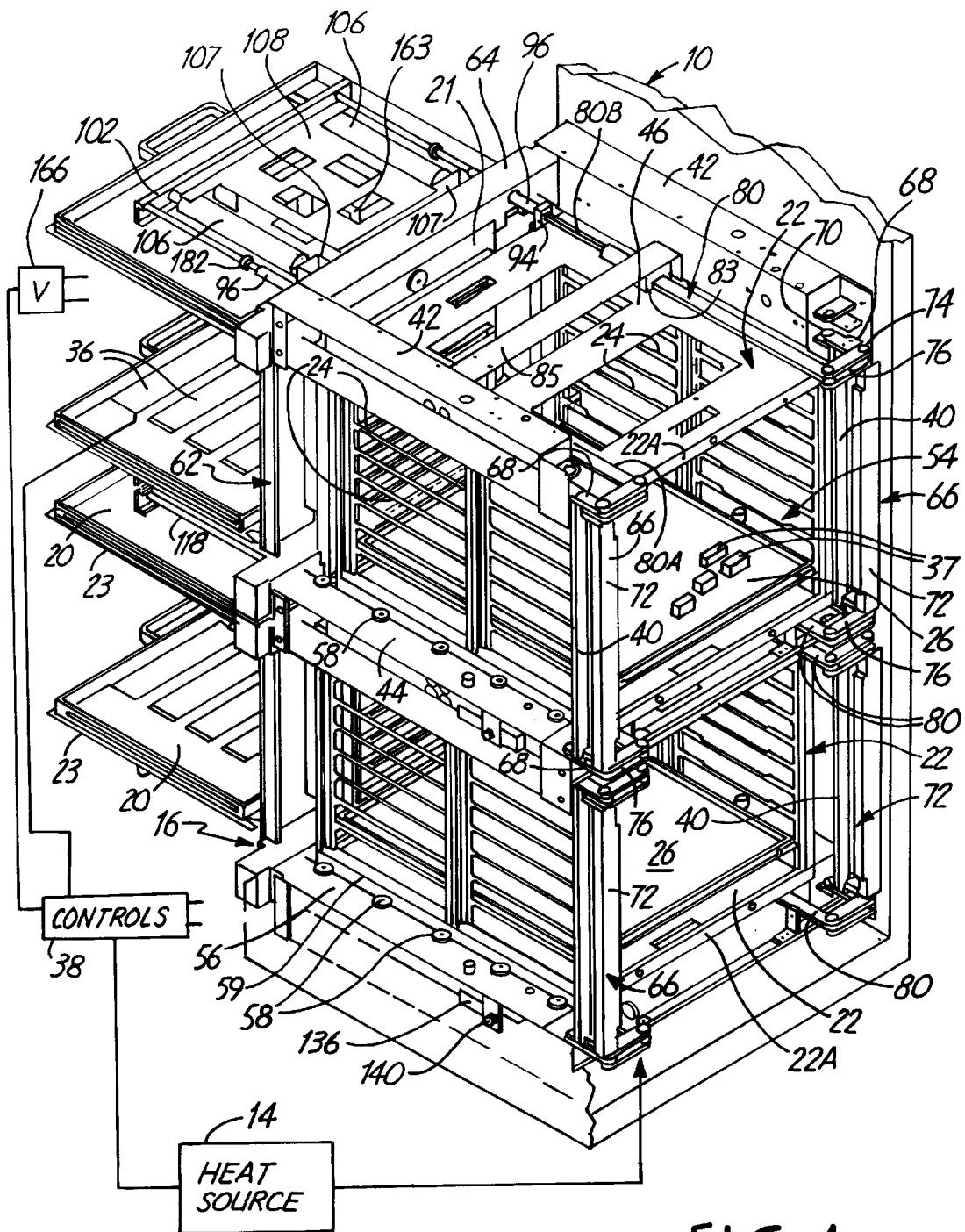
FIG. 1 is a perspective view of a frame supporting two card cages or racks of printed circuit burn-in boards within an oven, with parts in section and parts broken away.

In FIG. 1, a burn-in board oven is indicated schematically at 10 and includes walls and a floor, and is heated from a heat source 14 in a suitable manner to the desired temperature. Burn-in ovens are well known, and thus details of how the heat is controlled are not included. The oven 10 supports a frame 16 that is supported in oven 10 and has driver/receiver boards shown in FIG. 1 at 20 thereon at the rear wall 21 of the oven. The driver/receiver boards 20 can be mounted in any suitable manner, and supports trays 23 are shown for illustrative purposes.

Figure 3:
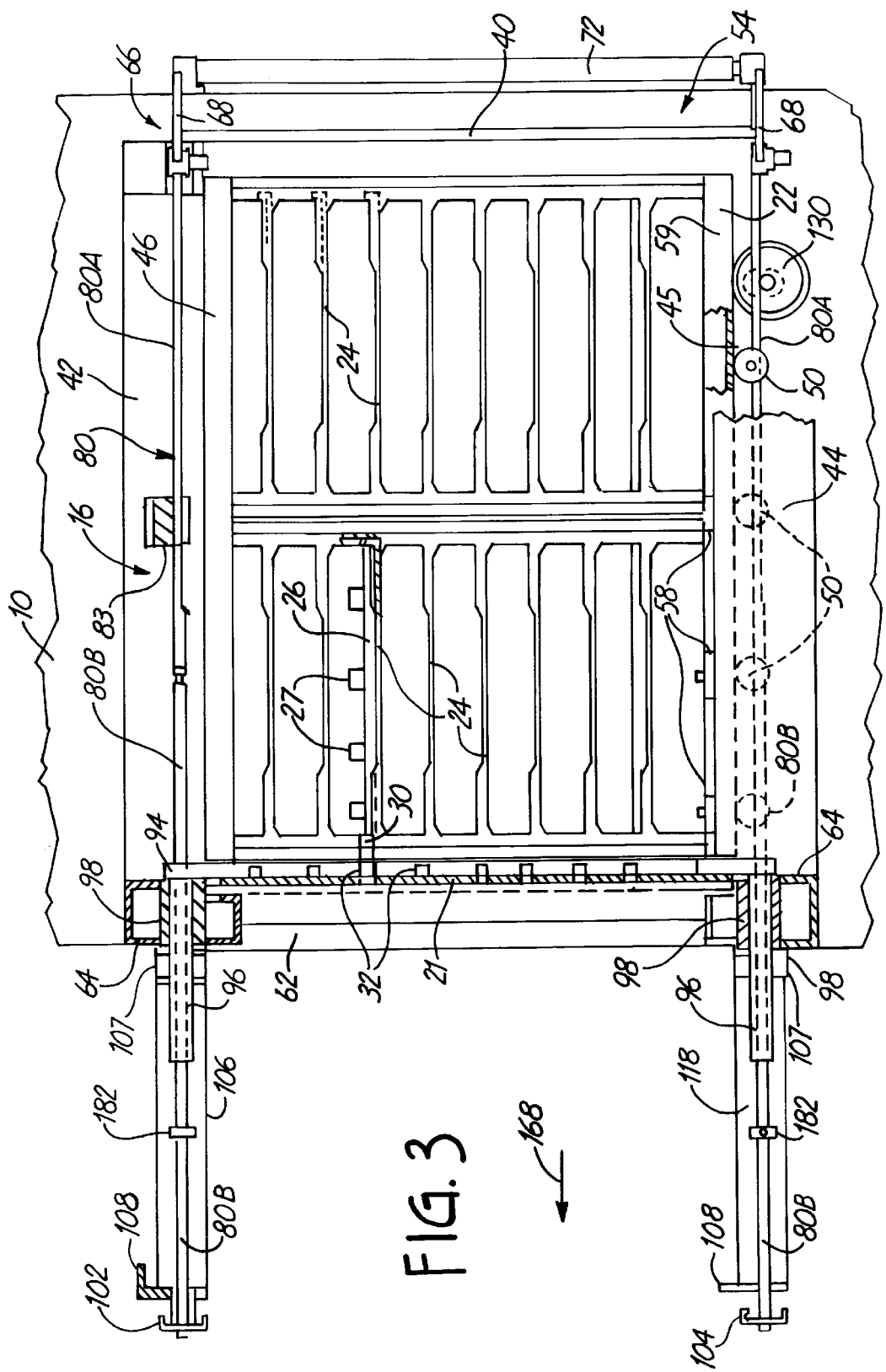
FIG. 3 is a schematic side elevational view of a card cage or rack and support mechanism shown in FIGS. 1 and 2.

The frame 16 is used for supporting and reacting insertion and ejection forces for one or more card cages or burn-in board racks 22. Each card cage or rack 22 has a plurality of support ledges shown schematically at 24, each of which is used to support one or more burn-in boards shown generally at 26, for testing purposes when connected to the driver/receiver boards 20. It is understood that the burn-in boards 26 are prepared in a normal manner, and are placed in the rack on the supports 24 outside of the oven 10. The components 27 on the boards 26 are connected to edge connectors shown at 30 in FIG. 3 schematically. The edge connectors 30 of each burn-in board 26 are the same and conventional as shown in cross section that is broken away to show a driver/receiver board connector 32 supported on the rear wall 21 of the oven and then connected to circuits on the driver/receiver boards.

Each of the driver/receiver boards 20 has a number of components shown in FIG. 3 at 27 for testing purposes that will be connected to suitable control circuitry illustrated schematically at 38 and connected to the driver/receiver boards 20 and the connectors 32 thereon in a normal manner. The controls 38 control the test of the burn-in boards.

The frame 16 has upright corner supports 40 at the input end, on opposite sides, that connect to longitudinal frame members 42 along the top of the frame, as well as longitudinal members 44 along the bottom of each frame. When there are two support frames 16, for two vertically stacked card cages or racks the frame members 44 at the lower side of the top frame also provide support for the lower frame.

Each of the card cages or racks 22 has top and bottom walls 46 and 45 (FIG. 3), that are substantially identically constructed. The bottom wall 45 has solid panels along its sides as does the top wall 46. There can be openings for air circulation in the center. The card cage or rack 22 thus has wall surfaces that can be supported relative to the frame 16 as the card cages or racks 22 are moved into the oven 10.

Figure 4:
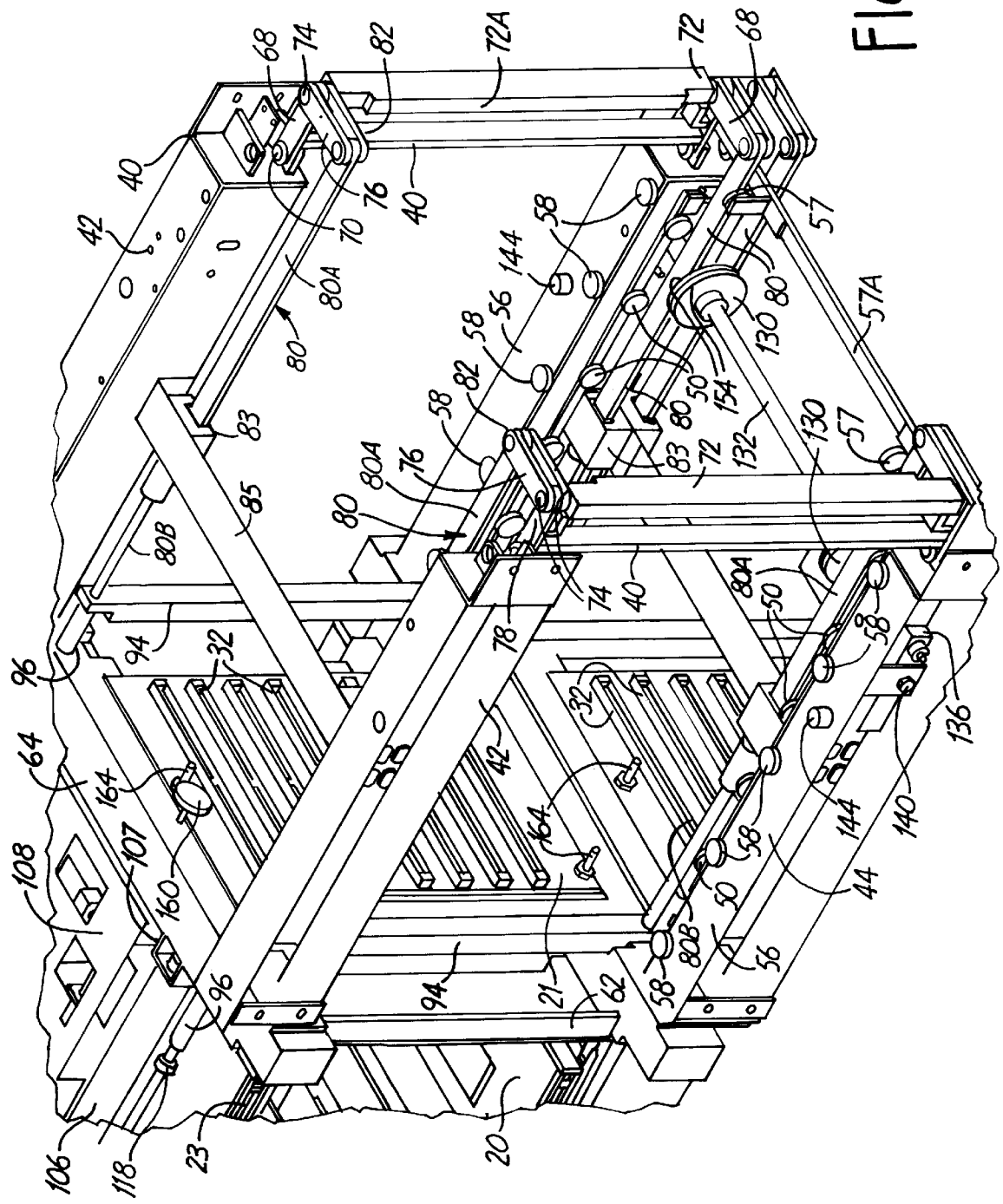
FIG. 4 is a perspective view looking from the side and inlet end of the oven to show the supports and operating mechanism of the device of FIG. 1.

As shown in FIGS. 3 and others, each of the lower frame members 44 has a plurality of guide and support rollers 50 rotatably mounted thereon on horizontal axes at suitable longitudinally spaced locations, and the tops of the rollers 50 are made so that they will define a plane. The rollers engage the bottom surface of the bottom wall 45 of a supported card cage or rack 22 as the rack is moved inwardly from an inlet end 54 of the oven to the plug-in end at the back wall 21 where the driver/receiver boards 20 are mounted. The rollers 50 form guides or a guide track for the racks 22. Additionally, the bottom frame members 44 have horizontal walls 56 that mount a plurality of side guide rollers 58 that are rotatably mounted about vertical axes and are positioned to engage side surfaces 59 of the lower side of the card cage or rack 22. At the inlet end 54 extra support rollers 57 (FIG. 4) can be mounted on a suitable cross member 57A to aid in getting the card cage or rack 22 started into the frame 16. Thus the card cage or rack is mounted for movement in the frame 16 and in the oven 10 on freely rotating rollers so that there is little friction that resists movement of the rack from the inlet end 54 to the rear wall plug-in end.

There are no top cross members at the inlet end 54 of the frame or oven, since the frame is bolted to the oven walls, but at the rear wall there are upright frame members 62 on each side that are joined to the top and bottom longitudinal frame members 42 and 44, and there are cross members 64 at the top and bottom on the plug-in end or rear wall 21. The driver/receiver boards 20 are held in place on such frame members on the exterior of the oven.

At the oven inlet or open end 54, there are a pair of side inserter pusher bar assemblies 66 for each card cage or rack. The inserter pusher bar assemblies 66 include sets of top and bottom pivoting links 68 that are pivotally mounted as at 70 aligning generally vertical pivots to brackets supported on the frame 16. The links 68 in turn mount the vertically extending pusher bars 72 on suitable pivot pins 74 at the outer ends of the links 68. A control arm 76 is fixed to the pusher bars 72 and extends outwardly therefrom along the plane of the pusher bars 72. Suitable sliding actuator links 80 are pivotally mounted as at 82 to the outer ends of the control arms 76 on each side of the frame 16 and at both the top and the bottom, and these actuator links 80 at the top and bottom comprise flat strap link portions 80A along a portion of the actuator links 80. The flat strap link portions 80A are slidably supported in guides 83 at both the top and bottom of each frame 16. The guides 83 are supported on cross members 85.

The flat strap portions 80A join rods rod members or 80B forming part of the control links 80 and each of the rod members or rods 80B in turn is slidably mounted through provided bores in a pair of ejector bars 94 that are positioned on opposite sides of the frame, near the back wall 21, as shown. The ejector bars 94 are aligned to intercept the inner end of the card cage or rack 22 where the connectors 30 for the burn-in boards 26 are positioned. The ejector bars 94 extend for the full height of the rack 22 as shown. The rod members or rods 80B slidably pass through bores in sleeves 96 that are mounted in suitable bushings 98 (see FIG. 3) in the cross members 64 at both the top and the bottom of the frame, and at opposite sides of the frame 16. There are four of the bushings hubs 98, and there are four of the rods 80B for each card cage or rack frame 16.

Figure 2:
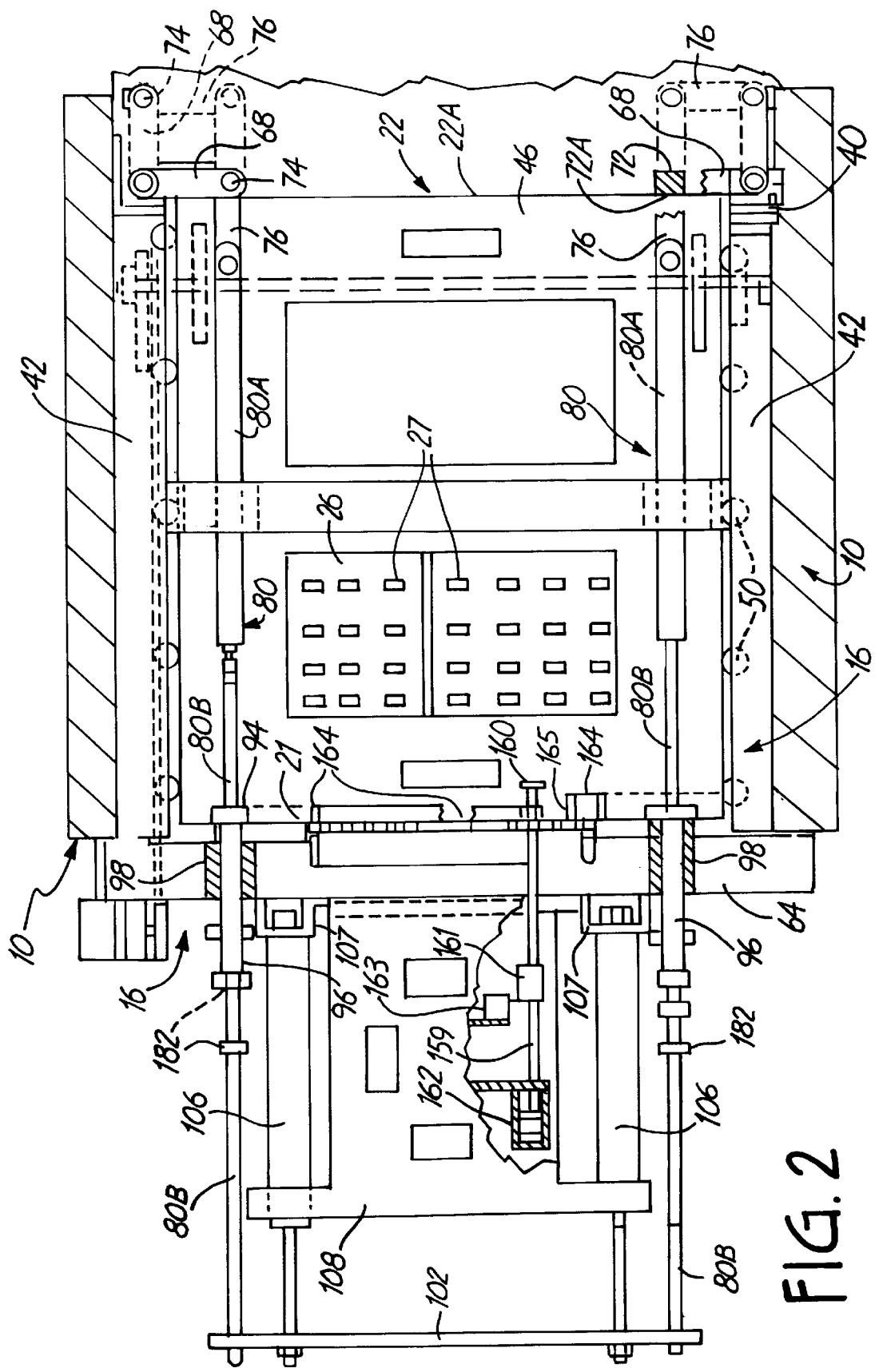
FIG. 2 is a fragmentary top schematic plan view of the frame of FIG. 1 with parts removed for sake of clarity.
Figure 6:
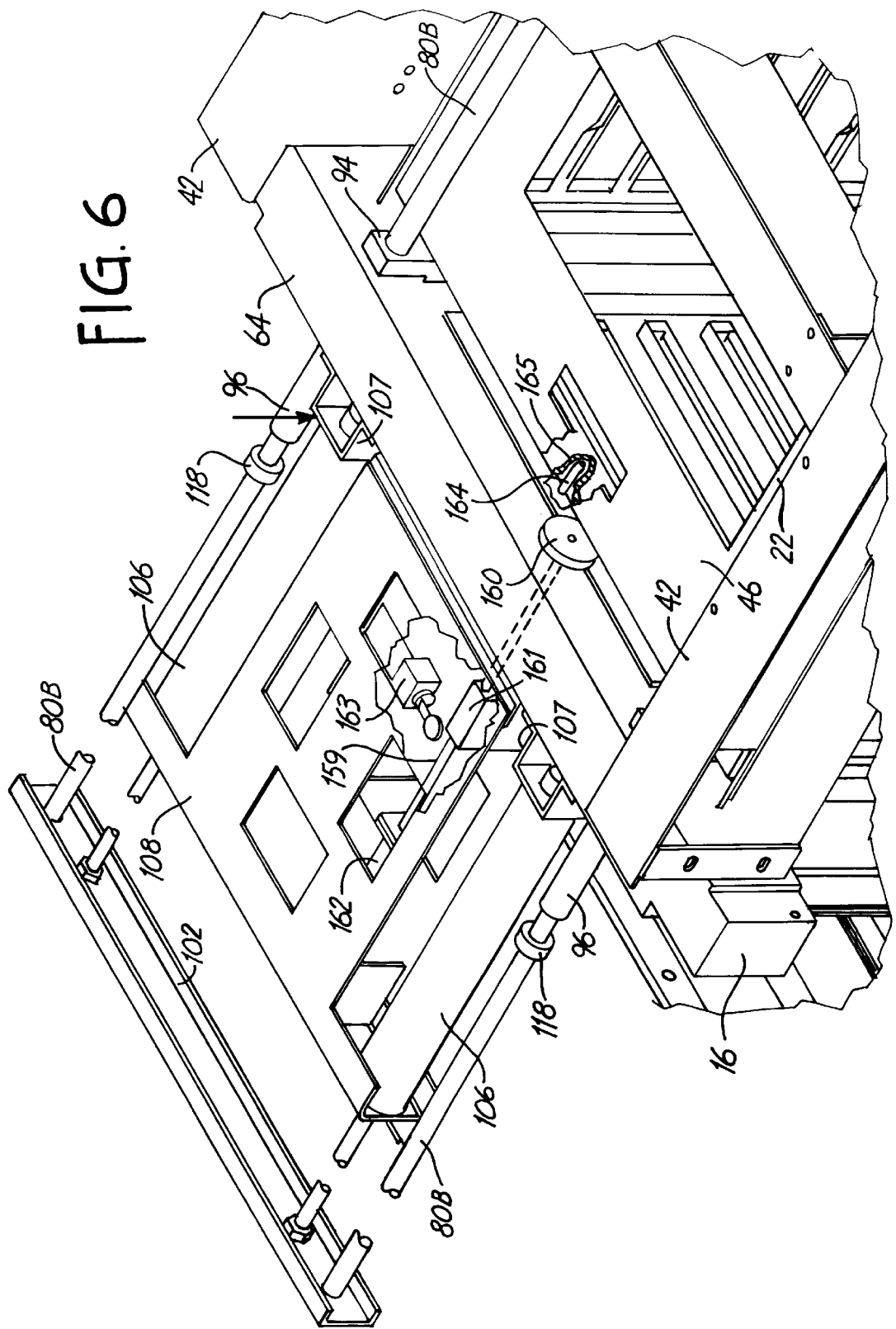
FIG. 6 is a perspective view similar to FIG. 5 showing the card cage or rack in position where the connectors are connected.

The rods 80B extend outwardly from the rear wall 21 of the frame 16, through the sleeves 96. As shown in FIGS. 2 and 3, the rods 80B at the top of the frame are connected to a cross link 102, and the bottom rods 80B are connected to a cross link 104. Actuators 106 are mounted on opposite sides of the top of frame 16. The actuators 106 have base ends supported on brackets 107 and also held by a frame panel 108 (see FIG. 1 and 6) that are both fixed relative to the cross member 64 at the top of the frame. The actuator supports can take any desired shape. The panel 108 is secured to the outer ends of the actuators 106 to provide a stable support.

The lower or bottom rods 80B and cross link 104 are controlled by a pair of actuators 118. A similar bracket 107 and france panel 108 are used at the bottom of the frame 16 to support actuators 118. The actuators 106 and 118 have extendable and retractable rods that are connected to the cross members 102 and 104, respectively, so that the actuators, which are double acting air cylinders will move the cross members toward or away from the rear wall 21 of the oven under pneumatic pressure. This also causes the actuator links 80 to be longitudinally moved.

When a card cage or rack 22 is to be inserted at the inlet or open end 54, the rack will be slid along suitable guides into the oven opening, and the bottom wall 45 will be engaged by a pair of friction drive rollers 130 mounted onto a cross shaft 132 (see FIGS. 3, 4 and 7) that passes through suitable slots in the side frame members 44. As shown in FIGS. 7 and 8, the ends of shaft 130 are mounted onto a pair of pivoting arms 136, one on each side of the frame 16. The arms 136 are mounted onto the frame members 44 with suitable depending straps 138, and each arm 136 pivots on a pivot pin 140. The shaft 132 that is shown in FIGS. 7 and 8 is mounted in a suitable bearing on the arm 136. The arms 136 are spring loaded with self-contained spring plungers 144 that are mounted on the side frame members 44 respectively. The plungers 144 are items that have a housing with an internal spring urging the plungers outwardly. The plungers exert a force tending to cause the shaft 132 to raise upwardly. When the card cage or rack 22 engages the friction drive rollers 130, the weight of the card cage will cause the spring acting on the plunger 144 to retract, and a friction drive force acts from the drive wheels 130 to the bottom wall of the card cage or rack. A motor 148 has a sprocket that drives a chain 150 shown schematically in FIG. 8. The chain 150 in turn drives a sprocket 149 on shaft 132. The motor 148 is positioned outside of the oven 10, and the chain 150 passes through openings designed to restrict heat loss.

The friction drive rollers 130 are provided with a pair of annular grooves on their outer surface so that suitable (high temperature) O-rings 154 (FIG. 4) can be mounted on the rollers to provide the friction drive. The card cage or rack 22 with the burn-in boards 26 supported thereon rolls along the support rollers 50 on the side frame members 44, as guided by guide rollers 58 while being driven by the friction drive rollers 130.

Figure 5:
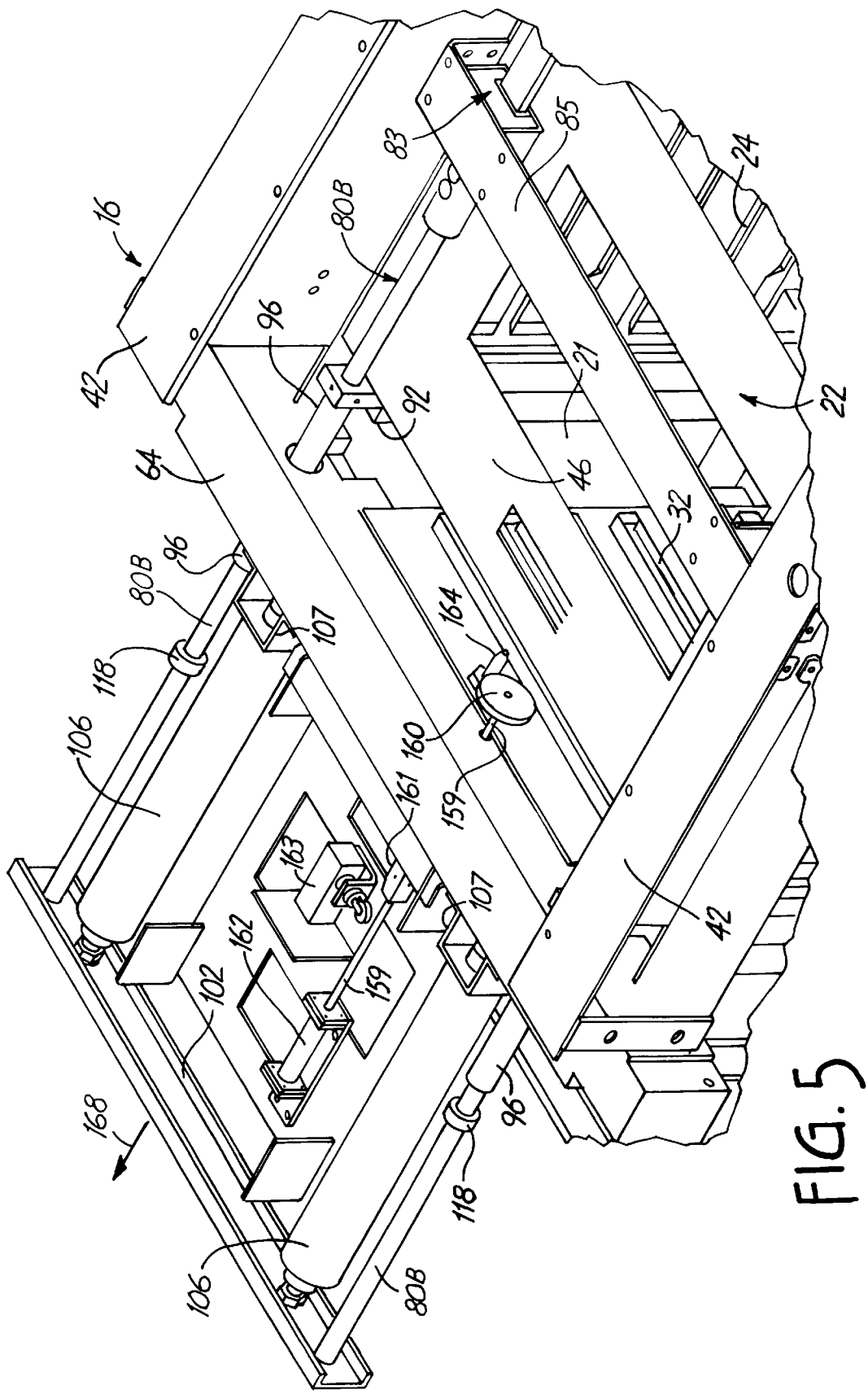
FIG. 5 is a perspective top view showing the printed circuit burn-in board card cage or rack when it is pushed near its home position.

When the card cage or rack moves adjacent to rear wall 21 and the burn-in boards 20, the leading end of the card cage or rack engages guide pins 164 that are supported on the back wall for alignment of connectors 30 with connectors 32 for the driver/receiver boards 26. The rack has receptacles 165. There may be two guide pins 164 along the bottom of the back wall 21, and one pin 164 centered at the top. A sliding target actuator 160 supported on the top cross member and is engaged by the card cage or rack and as the mating receptacles 165 on the card cage slide over the pins 164, the target actuator 160 slides relative to the frame on a rod 159 that is slidably mounted in top cross member 64. The rod 159 is spring loaded outwardly with a spring assembly 162 (FIGS. 2 and 5).

The rod 159 also carries an actuator block 161 to actuate a microswitch 163. The microswitch 163 will be actuated by the positioning of the card cage or rack 22, and provides a signal to energize a valve 166 (FIG. 1) providing fluid under pressure to the cylinders or actuators 118 and 106. This will cause the actuators 106 and 118 to extend their respective rods and move the cross members 102 and 104 in direction as indicated by the arrow 168. This will load tension onto the rods 80B and straps 80A, which will cause the straps 80A to pull on the control arms 76 at both the top and bottom, on both sides of each frame 16.

The links 68 pivot about the pivots 70, and the inserter pusher bars 72 will move with the outer end of the link 68 in an arc. The edge surface 72A of each of the inserter bars 72 will contact the rear surface 22A of the top and bottom walls of the partially inserted card cage or rack 22, and will exert a force generated by the actuators 106 and 118 to push the card cage or rack 22 into position over the guide pins 164 and with the connectors 30 and 32 fully seated. The ejector bars 94 are also moved inwardly to their retracted position by this insertion movement. The position of air actuators 106 and 118 can be sensed as desired.

When the rack 22 is fully seated the valve 166 can be shut off. Seating of the rack can also be sensed by the microswitch 163 if actuator block 161 has a second step, or with a separate microswitch. A signal is provided to indicate the connectors 30 and 32 are connected. The force from actuators 106 and 118 is such that it is adequate for moving the card cage or rack 22 into position with the burn-in board connectors 30 electrically coupled to the driver/receiver board connectors 32. Since the actuators use air pressure, the amount of force generated can be controlled quite precisely, and a spring like force is generated.

The friction drive rollers 136 will slip as the force required to move the card cage increases. The motor 148 can be shut off by the signal from microswitch 163. The burn-in boards 26 are then ready for testing. The oven 10 is heated with the heater 14 and the driver/receiver boards 20 are actuated to accomplish the operations that are necessary for burn in of the integrated circuits on the burn-in boards.

When the burn-in operation is completed, suitable signals will be given from controls 38 to shut off the heat source 14. After the oven 10 has cooled down, the oven would be opened, and the card cage or rack 22 can then be ejected. The valve 166 is operated to cause the rods of the actuators 106 and 118 to retract, moving the cross members 102 and 104 back toward the driver/receiver boards 26. Each of the rods 80B has a lost motion collar 182 mounted thereon. This collar will be spaced from the end of the aligning sleeve 96 when the rods 80B are extended and the inserter bars 72 are against the back surface 22A of the rack 22.

As the cylinders 106 and 118 retract, the rods 80B and the links 80A are loaded in compression and the actuator arms 76 will be reversed in direction. The inserter pusher bars 72 move away from the back of card cage or rack 22, and back toward the positions shown in solid lines in FIG. 1. The inserter pusher bars swing back out of the way, so the card cage or rack can be moved away from the back wall of the oven. As clearance is provided, but before the inserter bars are all the way out to their full open position as shown in FIG. 1, the collars 182 will contact the ends of sleeves 96 on both sides of the frame and at the top and the bottom, and the sleeves 96 will be slid through the bushings 98 and will push the ejector bars 94 toward the card cage or rack. The ejector bars will act upon the front surface 22B of the card cage or rack and push the rack off the connectors 32 to disengage the connectors and also push the rack off the guide pins 164. At the time this happens, the inserter bars 72 will be moved to be fully retracted so the opening 54 is unobstructed. The motor 148 will be powered to drive the friction rollers 130 in opposite direction from the loading direction. The friction drive rollers 130 will move the card cage or rack and the fully tested burn-in boards out the open end 54 of the oven.

The inserter/ejector of the present invention provides positive seating of the connectors, and positive ejection of the connectors when the test is done. The friction drive rollers 130 move the card cage or rack with adequate force for normal operation, but will not cause damage because the drive will slip if there is something in the way or if there is something that is not quite lined up. The card cage or rack could be mounted onto a cart that was at a suitable height, and roller trays of the like could be used between the cart and the oven 10. Once the card cage or rack gets at least partially into the oven 10 and the frame 16, the friction drive rollers 130 will do the driving of the rack and the burn-in boards 26. When the burn-in boards 26 get near the driver/receiver boards 20 the actuators 106 and 118 will be operated to positively align the card cage or rack and insert or couple the connectors. The ejector bars 92 are returned to be fully seated in their home position as the card cage or rack 22 is moved to the test position.

The mechanism is straight forward and reliable. The inserter bars provide a steady force that can be kept high for positive insertion of the card cages or racks and the connectors on the burn-in boards. The burn-in boards will be supported on the card cages or racks securely so they will react the insertion forces. The burn-in boards may be fastened down on the racks, if needed.

The alignment of the connectors 30 and 32 is accomplished with the guide pins 164 mating with receptacles 165 on the forward end wall of the card cage or rack 22. There are three alignment pins, as shown, one in the center laterally on the top cross member, and two on the lower cross members, one near each edge of the card cage or rack 22. The receptacles 165 have flared ends to aid in mating with pins 164.

Although the present invention has been described with reference to preferred embodiments, workers skilled in the art will recognize that changes may be made in form and detail without departing from the spirit and scope of the invention.

What is claimed is:

1. A support for a rack of burn-in boards inserted into a burn-in board oven having a plurality of driver/receiver boards mounted at one, end thereof comprising a frame having pair of spaced side frame members having a height, the driver/receiver boards mounted at the one end of the frame, and the driver/receiver boards having connectors facing an opposite open end;

guides on opposite sides of the frame for supporting a rack for holding burn-in boards, a separate inserter bar mounted on each of the side frame members adjacent the open end and extending along the height of the side frame members and movable from a first position wherein the inserter bars laterally clear the open end, to a second position wherein the inserter bars are moved inwardly, and a power actuator for said inserter bars to move the inserter bars between the first and second positions to provide a force on a rack for moving the rack toward the one end and inserting first electrical connectors on burn-in boards supported on the rack into second mating electrical connectors on the driver/receiver boards.

2. The apparatus of claim 1 and at least one ejector bar at the one end of the frame, said ejector bar being retractable to permit connection of the electrical connectors on burn-in boards supported on the rack with the mating electrical connectors on the driver/receiver boards, and said power actuator being operable to move the inserter bars to the second position clearing the opening and subsequently to move the at least one ejector bar against a rack having burn-in board connector inserted into connectors on driver/receiver boards to provide sufficient force to disengage the connectors between the driver/receiver boards and the burn-in boards.

3. The apparatus of claim 2, wherein the power actuator comprises four separate actuators for the inserter bars, one at each of four locations comprising upper and lower corners adjacent each of the side frame members.

4. The apparatus of claim 2, wherein the power actuator operates sliding links, said links being coupled to an actuator arm on each of the inserter bars, the inserter bars being mounted on inserter arms to pivot on an arc and connected to the actuator arms, linear movement of said links causing said inserter bars to pivot from their first position to the second position engaging a surface of a rack on the guide tracks.

5. The apparatus of claim 4, wherein said links include a rod portion, said rod portion being slidable through a sleeve, said at least one ejector bar being mounted on one of said rod portions, a hub for slidably mounting said sleeve on the one end of said frame, and a collar member mounted on said rod to form a lost motion link for said sleeve, whereby when the inserter bar is in a first position, said power actuator being operable to move said rod portion in direction for first moving the attached lost motion link to move the inserter bar to the second position and subsequently the collar engaging the sleeve to push the ejector bar on the one rod portion toward the open end of the frame.

6. The apparatus of claim 2, wherein there are a plurality of support rollers supported relative to the frame and forming a rotatable support for a rack inserted into the oven.

7. The apparatus of claim 6, and a set of guide rollers for guiding the sides of a rack being inserted into the oven and providing lateral guides for the rack.

8. The apparatus of claim 2, wherein there are a pair of ejector bars at the one end of the frame, which are laterally spaced apart and are supported for movement toward and away from the one end, the power actuator connected to said inserter bars including a movable rod member for moving at least one ejector bar away from the one end, the rod member carrying a lost motion link permitting the power actuator to first operate the inserter bars to move the inserter bars from the first position to the second position and then move the at least one ejector bar away from the one end.

9. The apparatus of claim 8, wherein there are a pair of ejector bars, wherein there are a pair of power actuators for operating the inserter bars, each power actuator having a movable rod member to form a pair of rod members, the rod members being slidably mounted relative to the frame, said ejector bars being slidably mounted on said rod members respectively, and separate sliding links coupling ends of said rod members to the inserter bars, a separate sleeve slidably mounted on each rod member, each sleeve being of size to engage an ejector bar mounted on the respective rod member, and a separate collar for actuating a sleeve on each of the rod members, said rod members sliding in said sleeves to actuate the inserter bars from the second to the first-position, and said collar then being spaced from said sleeves, and when the power actuators are operated to move the inserter bars from the second to the first position, the collar on each rod member subsequently engaging the respective sleeve on that rod member and moving the ejector bars in a direction away from the one end.

10. The apparatus of claim 9, wherein a sliding link strap connects the rod members to the inserter bars respectively, said inserter bars being mounted on pivoting arms and pivoting in an arc from the first position to the second position, control arms connected to the arms mounting the inserter bars, said straps being connected to the control arms for pivoting the control arms mounting the respective inserter bar.

11. The apparatus of claim 1 and friction drive wheels mounted on the frame between the one end and the open end positioned to engage a rack moving between the open end and one end.

12. The apparatus of claim 1 and guide pins on said one end for aligning a rack moving toward said one end.

13. The apparatus of claim 11 and a sensor for sensing the position of a rack being inserted in the frame as the rack moves adjacent to the one end, said sensor providing a signal for operating the actuator.

14. The frame for supporting at least one rack of burn-in boards for testing in a burn-in board oven, said burn-in board oven having a plurality of connectors for driver/receiver boards at one end thereof, said frame including guides for supporting a burn-in board support rack for movement toward the one end from an open end opposite the one end, said burn-in boards on said rack having connectors to mate with the connectors of the driver/receiver boards, a rack drive for engaging a rack entering the open end, and moving the rack toward the one end, a pair of inserter bars on opposite sides of said frame, movable from a first position wherein they are laterally clear of a rack moving into the oven, and mounted for movement to a second position where they engage an end surface of said rack after the rack has moved inwardly past the inserter bars and exert a force to move the rack toward one end of the frame, and an actuator mounted on the frame for moving said inserter bars from their first positions to the second positions to exert a force sufficient to engage connectors on burn-in boards on the rack with connectors of driver/receiver boards positioned at the one end of the frame.

15. The apparatus of claim 14 and a pair of ejector bars mounted at said one end, said ejector bars being movable to exert a force to urge the rack and burn-in boards mounted thereon toward the open end to disengage connectors between the burn-in boards on the rack and the connectors for the driver-receiver boards.

16. The apparatus of claim 15, wherein the actuator provides the force on the ejector bars, and a lost motion connector between the actuator and the ejector bars whereby when the actuator is operated to move the inserter bars from the second position to the first position, the ejector bars initially remain in a home position, and subsequently the lost motion linkage moving the ejector bars toward the open end.

* * * * *